(12) United States Patent
Yang et al.

(10) Patent No.: US 11,663,944 B2
(45) Date of Patent: May 30, 2023

(54) DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Bingqing Yang, Beijing (CN); Wenkai Mu, Beijing (CN); Haoliang Ji, Beijing (CN); Bo Feng, Beijing (CN); Xiaoxiao Chen, Beijing (CN); Tianxin Zhao, Beijing (CN); Ji Dong, Beijing (CN); Zhiying Bao, Beijing (CN); Wenjun Xiao, Beijing (CN); Yang Wang, Beijing (CN); Shijun Wang, Beijing (CN); Hao Xu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 17/296,268

(22) PCT Filed: Sep. 22, 2020

(86) PCT No.: PCT/CN2020/116904
§ 371 (c)(1),
(2) Date: May 24, 2021

(87) PCT Pub. No.: WO2021/057734
PCT Pub. Date: Apr. 1, 2021

(65) Prior Publication Data
US 2022/0028308 A1    Jan. 27, 2022

(30) Foreign Application Priority Data
Sep. 24, 2019  (CN) .......................... 201910907470.9

(51) Int. Cl.
*G09G 3/00* (2006.01)
*G09G 3/20* (2006.01)
*H01L 27/02* (2006.01)

(52) U.S. Cl.
CPC .............. *G09G 3/006* (2013.01); *G09G 3/20* (2013.01); *H01L 27/0292* (2013.01);
(Continued)

(58) Field of Classification Search
CPC .................... G09G 3/006; G09G 3/20; G09G 2310/0267; G09G 2330/04;
(Continued)

(56) References Cited

U.S. PATENT DOCUMENTS

2011/0310543 A1* 12/2011 Kim ................. G02F 1/133308
361/679.01

FOREIGN PATENT DOCUMENTS

CN    101236315 A    8/2008
CN    102298225 A    12/2011
(Continued)

*Primary Examiner* — Andrew Sasinowski
(74) *Attorney, Agent, or Firm* — Lippes Mathias LLP

(57) ABSTRACT

A display device is disclosed. The display device includes an array substrate and at least two driving units. The array substrate includes a peripheral region and a display region, the peripheral region surrounds the display region, the array substrate further includes a peripheral grounding line, and the peripheral grounding line is located in the peripheral region and surrounds the display region. The at least two driving units are located on at least one side of the array substrate, the driving unit includes at least two grounding pins, a grounding pin of at least one of the driving units is connected to the peripheral grounding line, and each of at least one grounding pin of one of two adjacent driving units is electrically connected to a corresponding grounding pin of the other adjacent driving unit.

19 Claims, 6 Drawing Sheets

(52) U.S. Cl.
CPC ............... *H01L 27/0296* (2013.01); *G09G 2310/0267* (2013.01); *G09G 2330/04* (2013.01); *G09G 2330/12* (2013.01)

(58) Field of Classification Search
CPC ............ G09G 2330/12; G09G 3/2092; G09G 2300/0426; G09G 2330/06; G09G 3/3208; G09G 3/3648; H01L 27/0292; H01L 27/0296
See application file for complete search history.

(56) References Cited

FOREIGN PATENT DOCUMENTS

| | | |
|---|---|---|
| CN | 107505747 A | 12/2017 |
| CN | 210429262 U | 4/2020 |
| CN | 111243508 A | 6/2020 |
| KR | 20160053234 A | 5/2016 |
| KR | 20170029761 A | 3/2017 |

* cited by examiner

DISPLAY DEVICE

The present application is a 371 of PCT Patent Application Serial No. PCT/CN2020/116904, filed on Sep. 22, 2020, which claims priority to Chinese Patent Application No. 201910907470.9, filed on Sep. 24, 2019 and entitled "DISPLAY PANEL AND DRIVING CIRCUIT THEREOF, AND DISPLAY DEVICE", both of which are incorporated herein by reference in its entirety.

TECHNICAL FIELD

The present disclosure relates to the field of display technologies, and in particular to a display device.

BACKGROUND

To prevent external static electricity from affecting a display panel, it is required to dispose an anti-static structure on the display panel to discharge the static electricity accumulated in the display panel.

SUMMARY

An embodiment of the present disclosure provides a display device.

According to a first aspect of embodiments of the present disclosure, a display device is provided. The display device includes an array substrate and at least two driving units. The array substrate includes a peripheral region and a display region, and the peripheral region surrounds the display region; the array substrate further includes a peripheral grounding line that is located in the peripheral region and surrounds the display region; the at least two driving units are located on at least one side of the array substrate, the driving unit includes at least one grounding pin, a grounding pin of at least one of the driving units is connected to the peripheral grounding line, and at least one grounding pin of each of two adjacent driving units is electrically connected.

Optionally, the array substrate further includes at least one first auxiliary lead line, the first auxiliary lead line is located in the peripheral region and arranged along a first side edge of the array substrate, and the first side edge is the side edge where the driving unit is located; the at least two grounding pins include a first grounding pin and a second grounding pin, and the first grounding pins of two adjacent driving units are connected by one of the first auxiliary lead lines.

Optionally, the array substrate further includes an auxiliary grounding lead line located in the peripheral region, and the first auxiliary lead line is electrically connected to the peripheral grounding line through the auxiliary grounding lead line.

Optionally, the auxiliary grounding lead line includes a first sub-lead and a second sub-lead; the first sub-lead extends along the first side edge, and two ends of the first sub-lead are connected to two ends of the peripheral grounding line respectively; the second sub-lead is in one-to-one correspondence with the first auxiliary lead line, and two ends of the second sub-lead are connected to the first sub-lead and the corresponding first auxiliary lead line respectively.

Optionally, the array substrate further includes a second auxiliary lead line that is in one-to-one correspondence with the first auxiliary lead line and arranged along the first side edge and located at a side of the corresponding first auxiliary lead line away from the display region; the at least two grounding pins further include a second grounding pin, and the second grounding pins of two adjacent driving units are connected by one of the second auxiliary lead lines.

Optionally, two ends of the peripheral grounding line are connected to third grounding pins of two outermost driving units in an arrangement direction of the at least two driving units respectively.

Optionally, the display device further includes a silver glue dot disposed on the array substrate and located in the peripheral region; the array substrate further includes a silver glue dot grounding lead line located in the peripheral region, and the silver glue dot is connected to one of the grounding pins through the silver glue dot grounding lead line.

Optionally, there are at least two silver glue dots and at least two silver glue dot grounding lead lines, the silver glue dot is in one-to-one correspondence with the silver glue dot grounding lead line, and two of the silver glue dot grounding lead lines are located at two ends of the first side edge respectively.

Optionally, the silver glue dot grounding lead line is insulated from the peripheral grounding line; or, the silver glue dot grounding lead line is connected to the peripheral grounding line.

Optionally, the array substrate further includes a test line located in the peripheral region and at a side of the peripheral grounding line close to the display region, and at least one of the driving units further includes a test pin connected to the test line.

Optionally, the test line surrounds the display region; in the arrangement direction of the at least two driving units, the two outermost driving units include the test pins, and two ends of the test line are connected to the two test pins respectively.

Optionally, the test line is configured to receive a test signal at a test stage and receive a ground signal at a display stage.

Optionally, the peripheral grounding line is located at the outermost side of the peripheral region.

Optionally, the peripheral grounding line is located at a source drain metal layer and/or a gate metal layer.

Optionally, the number of the driving units is 2-10.

Optionally, the driving unit is a flip chip thin film circuit.

Optionally, the array substrate further includes a gate driving circuit located in the peripheral region and at a side of the peripheral grounding line close to the display region.

Optionally, the display device further includes a printed circuit board, and a grounding lead line of the printed circuit board is electrically connected to the grounding pin of the driving unit.

According to another aspect of embodiments of the present disclosure, a display device is provided. The display device includes:

an array substrate including a peripheral region and a display region, wherein the peripheral region surrounds the display region;

at least two driving units located at a first side edge of the array substrate;

a color filter substrate in a connection with the array substrate to form a cell between two substrates opposite to each other; and a silver glue dot located in the peripheral region and connected to the array substrate and the color filter substrate respectively.

The driving unit includes a first grounding pin, a second grounding pin, a third grounding pin and a fourth grounding pin. Along an arrangement direction of the driving units, the third grounding pin, the fourth grounding pin, the first grounding pin and the second grounding pin on the m-th driving unit are arranged sequentially, and the second grounding pin, the first grounding pin, the fourth grounding pin and the third grounding pin on the n-th driving unit are arranged sequentially, wherein m is an odd number and n is an even number.

The array substrate includes a peripheral grounding line, a first auxiliary lead line, a second auxiliary lead line, an auxiliary grounding lead line and two silver glue dot grounding lead lines which are located in the peripheral region.

The peripheral grounding line surrounds the display region and is arranged along a second side edge other than the first side edge of the array substrate. One end of the peripheral grounding line is connected to the third grounding pin of one outermost driving unit in the arrangement direction of the at least two driving units, and the other end of the peripheral grounding line is connected to the third grounding pin of the other outermost driving unit in the arrangement direction of the at least two driving units.

The first auxiliary lead line is arranged along the first side edge of the array substrate; in two adjacent driving units, the first grounding pin of one driving unit and the first grounding pin of the other driving unit are connected by one of the first auxiliary lead lines.

The auxiliary grounding lead line includes a first sub-lead and a second sub-lead; the first sub-lead extends along the first side edge, and two ends of the first sub-lead are connected to two ends of the peripheral grounding line respectively; the second sub-lead is in one-to-one correspondence with the first auxiliary lead line, and two ends of the second sub-lead are connected to the first sub-lead and the corresponding first auxiliary lead line respectively.

The second auxiliary lead line is in one-to-one correspondence with the first auxiliary lead line, and arranged along the first side edge and located at a side of the corresponding first auxiliary lead line away from the display region; the second grounding pins of two adjacent driving units are connected by one of the second auxiliary lead lines.

One end of the silver glue dot grounding lead line is connected to the corresponding silver glue dot respectively, the other end of one silver glue dot grounding lead line is connected to the fourth grounding pin of one outermost driving unit in the arrangement direction of the at least two driving units, and the other end of the other silver glue dot grounding lead line is connected to the fourth grounding pin of the other outermost driving unit in the arrangement direction of the at least two driving units.

Optionally, in the arrangement direction of the at least two driving units, the two outermost driving units include test pins respectively.

The array substrate further includes a test line that is located in the peripheral region and at a side of the peripheral grounding line close to the display region, the test line surrounds the display region, and two ends of the test line are connected to the two test pins respectively.

BRIEF DESCRIPTION OF THE DRAWINGS

For clearer descriptions of the technical solutions in the embodiments of the present disclosure, the following briefly introduces the accompanying drawings of the embodiments. Apparently, the accompanying drawings in the following description show merely some embodiments of the present disclosure rather than limit the present disclosure.

DETAILED DESCRIPTION

For clearer descriptions of the objects, technical solutions and advantages in the embodiments of the present disclosure, the technical solutions in the embodiments of present disclosure are clearly and fully described below in combination with the accompanying drawings of the embodiments of the present disclosure. Apparently, the described embodiments are merely some embodiments, rather than all embodiments, of the present disclosure. Based on the described embodiments of the present disclosure, all other embodiments derived by a person of ordinary skill in the art without creative efforts shall fall within the protection scope of the present disclosure.

Unless otherwise defined, technical terms or scientific terms used in the present disclosure shall be of ordinary meanings as understood by those of ordinary skill in the art to which the present disclosure pertains. The terms "first" and "second" and a similar term used in the present disclosure do not denote any order, quantity, or importance, but are merely used to distinguish different components. Similarly, the term "one", "a/an" or "the" or a similar term denotes at least one, instead of limitation to quantity. The term "comprising" or "including" or a similar term is intended to mean that elements or items which appear before the term include the elements or items listed after the term and their equivalents, without excluding other elements or items. The term "connection" or "connected" or a similar term is not limited to physical or mechanical connection, and may include electrical connection, and the connection may be direct or indirect. The terms "up", "down", "left", "right" and the like are merely used to indicate a relative positional relationship, and when the absolute position of a described object changes, the relative positional relationship may also change accordingly.

In the related art, for a liquid crystal display device, an anti-static structure includes a conductive tape and a silver glue dot, two ends of the silver glue dot are connected to a color filter substrate and an array substrate, respectively, a part of the conductive tape is attached on the color filter substrate, and a middle part of the conductive tape is attached on the array substrate after passing through the silver glue dot and connected to a silver glue dot grounding lead line to which the silver glue dot is connected. The anti-static structure discharges static electricity accumulated in the color filter substrate and the array substrate into the silver glue dot grounding lead line by using the conductive tape.

Although the anti-static structure may satisfy test requirements of electrostatic discharge (ESD), the conductive tape is to be attached on the display panel after the display panel is assembled; for a large number of products, such an anti-static structure is time and labor consuming, affects a production efficiency, and increases labor costs.

Figure 1:
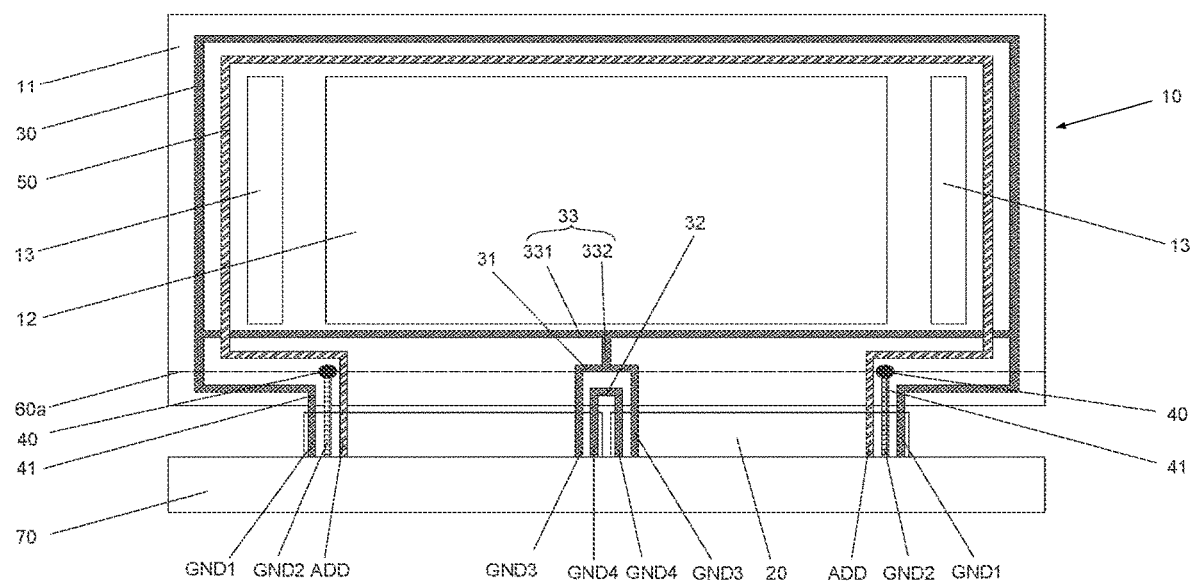
FIG. 1 is a schematic diagram of a structure of a display panel according to an embodiment of the present disclosure.

FIG. 1 is a schematic diagram of a structure of a display panel according to an embodiment of the present disclosure. As shown in FIG. 1, the display device includes an array substrate 10 and at least two driving units 20.

The array substrate 10 includes a display region 12 and a peripheral region 11, and the peripheral region 11 surrounds the display region 12. The array substrate 10 further includes a peripheral grounding line 30 that is located in the peripheral region 11 and surrounds the display region 12.

The driving unit 20 is located on at least one side of the array substrate 10 and connected to the array substrate 10. The driving unit 20 includes at least one grounding pin, a grounding pin of at least one of the driving units 20 is connected to the peripheral grounding line 30, and at least one grounding pin of each of two adjacent driving units 20 is electrically connected.

Optionally, the driving unit 20 located on at least one side of the array substrate 10 may refer to that the driving unit 20 is disposed on the array substrate 10 and located on at least one side edge of the array substrate 10, or the driving unit 20 is disposed at an outer side of at least one side edge of the array substrate 10 rather than being disposed on the array substrate 10. For example, when the driving unit 20 is a circuit adopting chip-on-glass (COG) packaging technology, the driving unit 20 may be disposed on the array substrate 10. For another example, when the driving unit 20 is a circuit adopting chip-on-film (COF) packaging technology, the driving unit 20 may be disposed at the outer side of the array substrate 10. At this time, the driving unit 20 may be disposed on, for example, a flexible printed circuit board (FPC).

The COF packaging technology refers to that a driving integrated circuit (IC) originally packaged on the array substrate is placed on a flexible flat cable (i.e., FPC) between the display panel and a printed circuit board (PCB), and may be folded to a back side of the display panel. When the COF packaging technology is adopted, the driving unit may be referred to as a flip chip thin film circuit.

Embodiments of the present disclosure are applied to the display device adopting the COF packaging technology, so that the use of the COF circuit may realize grounding of the peripheral grounding line more easily; at the same time, since the COF packaging technology is adopted, the embodiments of the present disclosure may be applied to a full screen, and may realize anti-static performance of the full screen better.

The display device according to an embodiment of the present disclosure may be a liquid crystal display (LCD) or an organic electroluminescence display (OLED). Driving units of these two displays may both adopt the above-mentioned COF packaging technology.

In most display devices, the driving unit 20 is arranged at a side of the array substrate 10. For ease of description, in the embodiment shown in FIG. 1 and the following description, the driving unit 20 located at a side of the array substrate 10 is described as an example. Optionally, the driving unit 20 may also be disposed at two sides or several sides of the array substrate in addition to one side of the array substrate.

In the display device according to an embodiment of the present disclosure, the peripheral grounding line is disposed and connected to the grounding pin of the driving unit, and the driving unit itself is also electrically connected to the external printed circuit board. Therefore, the static electricity of the peripheral grounding line may be directed to a grounding terminal of the printed circuit board, so that the peripheral grounding line and the silver glue dot grounding lead line may both reduce the static electricity. Thus, the conductive tape at the silver glue dot in the existing design scheme may be removed, thereby improving the production efficiency. Further, at least one grounding pin of each of two adjacent driving units is electrically connected to enable signals between driving chips to be more stable without being easily affected by the static electricity.

Optionally, the array substrate further includes a first auxiliary lead line 31. The first auxiliary lead line 31 is located in the peripheral region 11 and arranged along a first side edge of the array substrate 10.

The driving unit 20 includes a first grounding pin GND3. In two adjacent driving units 20, the first grounding pin GND3 of one driving unit 20 (i.e., the driving unit 20 at the left side) is electrically connected to the first grounding pin GND3 of the other driving unit 20 (i.e., the driving unit 20 at the right side) through the first auxiliary lead line 31.

Optionally, the array substrate 10 further includes an auxiliary grounding lead line 33. The first auxiliary lead line 31 is electrically connected to the peripheral grounding line 30 through the auxiliary grounding lead line 33. Such design enables the peripheral grounding line 30, the auxiliary grounding lead line 33, the first auxiliary lead line 31 and the driving unit 20 to form a closed loop of the grounding line, thereby shielding the static electricity better.

Optionally, the array substrate 10 further includes a second auxiliary lead line 32. The second auxiliary lead line 31 is arranged along the first side edge and located at a side of the corresponding auxiliary lead line 31 away from the display region 12.

As shown in FIG. 1, the driving unit 20 further includes a second grounding pin GND4. In two adjacent driving units 20, the second grounding pin GND4 of one driving unit 20 is connected to the second grounding pin GND4 of the other driving unit 20 through one of the second auxiliary lead lines 32. For example, as shown in FIG. 1, the second grounding pin GND4 of the driving unit 20 at the left side is electrically connected to the second grounding pin GND4 of the driving unit 20 at the right side through the second auxiliary lead line 32.

Adjacent driving units 20 are electrically connected to the grounding pins through the second auxiliary lead line 32, so that signals between the driving units become more stable and are not easily affected by the static electricity or even pulled. At the same time, the peripheral grounding line 30, the auxiliary grounding lead line 33, the first auxiliary lead line 31 and the driving unit 20 form the closed loop of the grounding line, thereby shielding the static electricity better.

Optionally, as shown in FIG. 1, the auxiliary grounding lead line 33 includes a first sub-lead 331 and a second sub-lead 332; the first sub-lead 331 extends along the first side edge, for example, the first sub-lead 331 is parallel to the first side edge, and two ends of the first sub-lead 331 are connected to two ends of the peripheral grounding line 30 respectively; two ends of the second sub-lead 332 are connected to the first sub-lead 331 and the corresponding first auxiliary lead line 31 respectively. Such design of the auxiliary grounding lead line 33 may save a wiring space better. The auxiliary grounding lead line 33 mainly serves to form the closed loop of the peripheral grounding line 30, and therefore, as long as the grounding pin of the driving chip and the peripheral grounding line 30 may be electrically connected to form the closed loop, such wiring design of the auxiliary grounding lead line 33 all falls within the protection scope of the present disclosure.

As shown in FIG. 1, the peripheral grounding line 30 is arranged along a side edge other than the first side edge of the array substrate 10. As shown in FIG. 1, the array substrate 10 is rectangular, and the driving unit 20 is located at a lower edge of the rectangle, so that the first side edge is the lower edge of the rectangle. The peripheral grounding line 30 includes three sub-lines connected sequentially, and these three sub-lines are parallel to a left edge, an upper edge and a right edge of the rectangle respectively. Therefore, the peripheral grounding line 30 surrounds outer sides of three side edges of the display region 12 to form a periphery of the display region 12.

In some possible embodiments, two ends of the peripheral grounding line 30 are connected to a grounding pin respectively. For example, two ends of the peripheral grounding line 30 are connected to the grounding pins of two outermost driving units 20 in the arrangement direction of the at least two driving units 20 respectively. By connecting with the grounding pins of two outermost driving units, the peripheral grounding line may surround a larger area on the array substrate, thereby providing more comprehensive electrostatic protection.

As shown in FIG. 1, in this embodiment, there are two driving units 20, and each driving unit 20 includes a fourth grounding pin GND1. One end of the peripheral grounding line 30 is connected to the fourth grounding pin GND1 of the driving unit 20 at the left side, and the other end of the peripheral grounding line 30 is connected to the fourth grounding pin GND1 of the driving unit 20 at the right side.

Optionally, in other embodiments, only one end of the peripheral grounding line 30 is connected to the grounding pin of the driving unit; or, two ends of the peripheral grounding line 30 are connected to two grounding pins of the same driving unit 20.

Optionally, the display device further includes a silver glue dot 40 disposed in the peripheral region 11 of the array substrate 10 and connected to a grounding pin of the driving unit 20 through a silver glue dot grounding lead line 41.

Optionally, as shown in FIG. 1, the silver glue dot grounding lead line 41 and the peripheral grounding line 30 are disconnected, that is, insulated from each other. In this way, when the silver glue dot grounding lead line 41 is broken down by the static electricity, the peripheral grounding line 30 may still work normally to prevent the static electricity; or, when the peripheral grounding line 30 has a failure, the silver glue dot grounding lead line 41 may still work normally to prevent the static electricity.

Alternatively, in other embodiments, the silver glue dot grounding lead line 41 and the peripheral grounding line 30 may also be connected to each other.

Optionally, as shown in FIG. 1, there are two silver glue dots 40 and two silver glue dot grounding lead lines 41, the silver glue dot 40 is correspondingly connected to the silver glue dot grounding lead line 41, and two silver glue dot grounding lead lines 41 are disposed at two ends of the first side edge respectively with a distance from the display region. That is, the silver glue dot grounding lead line 41 is located at a side of the peripheral region 11 of the array substrate away from the display region. Fourth grounding pins GND2 of two driving units 20 are correspondingly connected to two silver glue dot grounding lead lines 41 respectively.

It is to be noted that the number and the position of silver glue dots 40 may both be set according to actual requirements. For example, at least two silver glue dots are set or one silver glue dot is set, which is not limited in the present disclosure. Correspondingly, the number of silver glue dot grounding lead lines 41 is also changed along with the number and the position of silver glue dots 40.

Optionally, as shown in FIG. 1, the peripheral grounding line 30 is located at the outermost side of the peripheral region 11. In this way, the peripheral grounding line disposed outermost may surround an internal circuit structure, thereby preventing the external static electricity from affecting the internal circuit better.

Optionally, as shown in FIG. 1, the array substrate 10 further includes a gate on array (GOA) circuit 13 located in the peripheral region 11. The GOA circuit 13 is located between the display region 12 and the peripheral grounding line 30, so that the peripheral grounding line 30 provides electrostatic protection to the GOA circuit 13. In an exemplary embodiment, the GOA circuit 13 is located at two opposite sides of the display region 12 along the arrangement direction of at least two driving units 20 respectively.

It is to be noted that in the embodiment shown in FIG. 1, along the arrangement direction of a plurality of driving units 20, for example, in an order from left to right, the third grounding pin GND1, the fourth grounding pin GND2, the first grounding pin GND3 and the second grounding pin GND4 on the m-th driving unit are arranged sequentially, and the second grounding pin GND4, the first grounding pin GND3, the fourth grounding pin GND2 and the third grounding pin GND1 on the n-th driving unit are arranged sequentially, wherein m is an odd number and n is an even number.

In this way, in the above-mentioned connection fashion, the two driving chips 20 connecting the peripheral grounding line 30 and the silver glue dot grounding lead line 41 are disposed at the beginning and the end of a whole row of driving chips respectively. In this way, the two driving chips 20 connecting the peripheral grounding line 30 and the silver glue dot grounding lead line 41 disposed at two outermost sides respectively may avoid crossover of the lines better and help the wiring to be more orderly and simpler.

In some optional embodiments, as shown in FIG. 1, the array substrate 10 further includes a test line 50 located in the peripheral region 11 and at a side of the peripheral grounding line 30 close to the display region 12, and electrically connected to a test pin ADD of the driving unit 20.

For example, the test line 50 is an array test (AT) line that is usually electrically connected to an AT circuit disposed in a free region of a mother board of the display panel and used to complete a test under a test signal provided by the AT circuit. In this way, the AT line is to be connected into the AT circuit outside the display panel. However, after the test is completed, the mother board of the display panel is to be cut into a single display panel, and the AT line connected to the AT circuit is cut off, thereby forming a line fracture at an edge of the display panel. Such a fracture may generate the static electricity and further affect the work of the display panel.

To avoid such a problem, the test line 50 of the present disclosure is disposed on the array substrate 10 to be within the display panel and electrically connected to the test pin of the driving unit 20, so as to provide the test signal to the driving unit 20 to complete the test without directing the test line 50 out of the display panel. Therefore, when the mother board is cut, no cutting fracture of the test lead line is left, thereby avoiding the static electricity generated by the cutting fracture.

Optionally, as shown in FIG. 1, the test line 50 and the peripheral grounding line 30 are disconnected, and the test line 50 and the silver glue dot grounding lead line 41 are also disconnected. Therefore, on the one hand, mutual interference of signals is prevented; on the other hand, when a line fails due to breakdown of the static electricity, other lines may still work normally.

In some optional embodiments, as shown in FIG. 1, the test line 50 is disposed on the periphery of the display region 12 of the array substrate, and two ends of the test line 50 are electrically connected to the driving unit 20. In this way, the test line 50 is disposed on the periphery of the display region 12, and the test line 50 and the driving unit 20 jointly form a closed loop. Therefore, when the peripheral grounding line 30 has a failure, the test line 50 may replace the peripheral grounding line 30 and serve as the peripheral grounding line 30 to shield the static electricity. Optionally, when the AT circuit is to be disposed, the AT circuit may be disposed on the top of the display panel (for example, a placement direction of FIG. 2); when the test line 50 surrounds the periphery of the display region 12, the test line 50 may also be connected to the AT circuit at the top simultaneously.

Optionally, the test line 50 is configured to receive a test signal at a test stage and receive a ground signal at a display stage. In this way, once the test is completed by using the test line 50 at the test stage, the test line 50 may play the same role as the peripheral grounding line 30 by receiving the ground signal at the display stage, thereby improving the anti-static performance of the display panel.

Optionally, as shown in FIG. 1, the display panel further includes a printed circuit board 70, and the grounding pins, such as the first grounding pin GND1, the second grounding pin GND2, the third grounding pin GND3 and the fourth grounding pin GND4 which are mentioned above, of the driving unit 20 are all electrically connected to a grounding lead line of the printed circuit board 70. Therefore, grounding is realized by connecting the grounding pin of the driving unit 20 with the ground signal of the grounding lead line of the printed circuit board 70.

Figure 2:
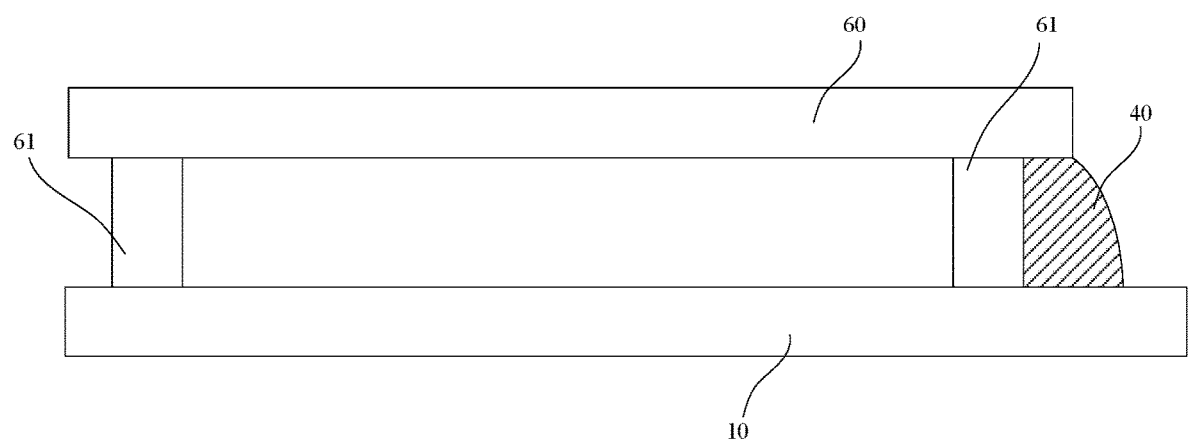
FIG. 2 is a schematic diagram of a sectional structure of a display panel according to an embodiment of the present disclosure.

Optionally, as shown in FIG. 2, the display device further includes a color filter substrate 60 in a connection with the array substrate to form a cell between two substrates opposite to each other, for example, connected by a sealant 61, in addition to the structure shown in FIG. 1.

A dotted line 60a in FIG. 1 is a projection formed by an edge of the color filter substrate 60 on the array substrate 10 after box alignment, and a part outside the dotted line is a part of the array substrate 10 that is uncovered by the color filter substrate 60 and usually includes some external circuit structures and lines, and the like; certainly, a fan-out zone and a fan-out line are also disposed between a wiring region of the array substrate and the driving chip, and lines not shown in the drawing do not represent that these lines are not needed in the array substrate. As shown in FIG. 1 and FIG. 2, the silver glue dot 40 is disposed between the edge of the color filter substrate 60 and the array substrate 10, so that the static electricity of the color filter substrate 60 is directed out to the external circuit through the silver glue dot 40 via the silver glue dot grounding lead line 41, thereby reducing the static electricity of the color filter substrate 10. The silver glue dot is electrically connected to the color filter substrate, and the design of the silver glue dot grounding lead line may direct the static electricity in the display panel to the outside. Further, the peripheral grounding line surrounds the periphery of the display region of the array substrate, thereby shielding the external static electricity well. Therefore, a combination of the silver glue dot grounding lead line and the peripheral grounding line achieves an anti-static effect on the display panel as a whole.

In an exemplary embodiment, the array substrate 10 includes a base substrate and a plurality of pixel units arrayed on the base substrate. Each pixel unit includes at least one thin film transistor and a pixel electrode connected to the at least one thin film transistor. The thin film transistor may be a top gate structure, a bottom gate structure, or the like, which is not limited in the embodiments of the present disclosure. Descriptions are made below with the top gate structure as an example. The array substrate includes a gate metal layer, a gate insulating layer, an active layer, a source drain metal layer, an insulating layer and a pixel electrode layer which are located on the base substrate sequentially.

Optionally, the peripheral grounding line 30 may be located at the gate metal layer and/or the source drain metal layer.

In an exemplary embodiment, the color filter substrate 60 may include a base substrate, a plurality of color resistance blocks arrayed on the base substrate, and black matrixes located between the color resistance blocks.

Figure 3:
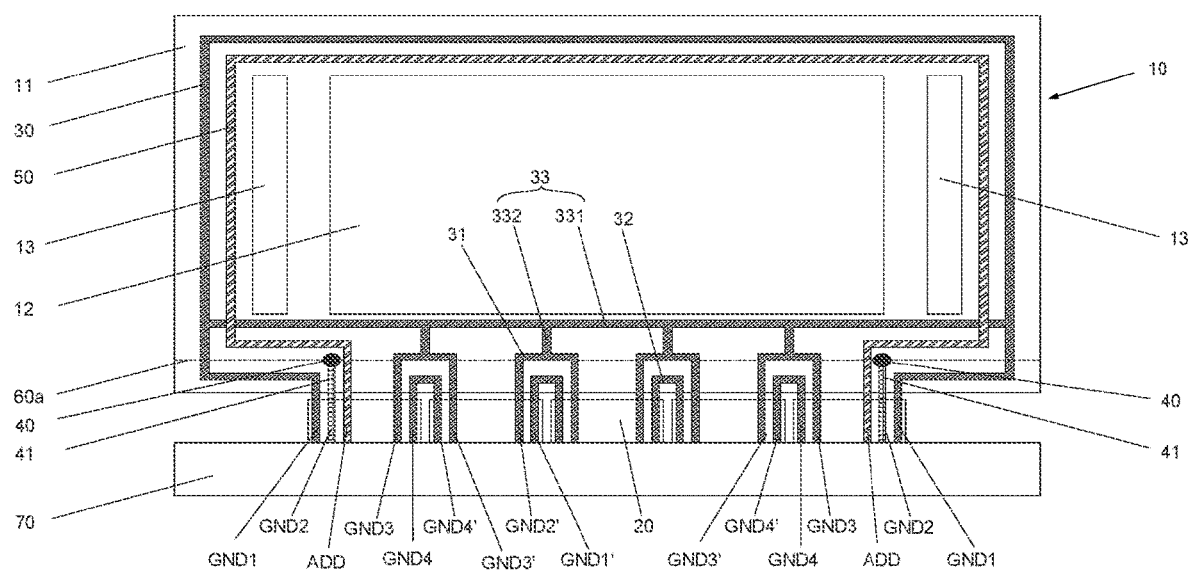
FIG. 3 is a schematic diagram of a structure of another display panel according to an embodiment of the present disclosure.

FIG. 3 is a schematic diagram of a structure of another display device according to an embodiment of the present disclosure. The display device shown in FIG. 3 and the display device shown in FIG. 1 are different in the number of driving units. For example, the number of driving units 20 in FIG. 3 is 5. The number of driving units 20 may be set according to actual requirements, for example, the number is 2-10.

As shown in FIG. 3, the display device includes an array substrate 10 and a driving unit 20. The array substrate 10 includes a display region 12 and a peripheral region 11, and the peripheral region 11 surrounds the display region 12. The driving unit 20 is located at a first side edge of the array substrate.

As shown in FIG. 3, each driving unit 20 includes a third grounding pin GND1/GND1', a fourth grounding pin GND2/GND2', a first grounding pin GND3/GND3', and a second grounding pin GND4/GND4'. Along an arrangement direction of the driving units 20, the third grounding pin GND1/GND1', the fourth grounding pin GND2/GND2', the first grounding pin GND3/GND3' and the second grounding pin GND4/GND4' on the m-th driving unit 20 are arranged sequentially, and the second grounding pin GND4/GND4', the first grounding pin GND3/GND3', the fourth grounding pin GND2/GND2' and the third grounding pin GND1/GND1' on the n-th driving unit 20 are arranged sequentially, wherein m is an odd number and n is an even number.

At least one grounding pin of each of two adjacent driving units 20 is electrically connected, so that signals between driving chips become more stable and are not easily affected by the static electricity or even pulled.

For example, the first grounding pin GND3 of one of two adjacent driving units 20 (refer to the leftmost driving unit in FIG. 3) is connected to the first grounding pin GND3' of its adjacent driving unit 20 through the first auxiliary lead line 31, and the first grounding pin GND3 of the other of two adjacent driving units 20 (refer to the rightmost driving unit in FIG. 3) is connected to the first grounding pin GND3' of its adjacent driving unit 20 through the first auxiliary lead line 31; the first grounding pins GND3' of other driving units 20 (refer to the middle driving units in FIG. 3) are correspondingly connected to the first grounding pins GND3' of their adjacent driving units 20 through the first auxiliary lead lines 31 respectively.

The first auxiliary lead line 31 is electrically connected to the peripheral grounding line 30 through the auxiliary grounding lead line 33. Such design enables the peripheral grounding line 30, the auxiliary grounding lead line 33, the first auxiliary lead line 31 and the driving unit 20 to form a closed loop of the grounding line, thereby shielding the static electricity better.

Optionally, as shown in FIG. 3, the auxiliary grounding lead line 33 includes a first sub-lead 331 and a second sub-lead 332; the first sub-lead 331 extends along the first edge, for example, the first sub-lead is parallel to the first side edge, and two ends of the first sub-lead 331 are connected to two ends of the peripheral grounding line 30 respectively; there are a plurality of second sub-leads 332, the second sub-lead 332 is in one-to-one correspondence with the first auxiliary lead line 331, and two ends of each second sub-lead 332 are connected to the first sub-lead 331 and the corresponding first auxiliary lead line 31 respectively. Such design of the auxiliary grounding lead line 33 may save the wiring space better. Certainly, it is conceivable that the auxiliary grounding lead line 33 mainly serves to form the closed loop of the peripheral grounding line 30. Therefore, as long as the grounding pin of the driving chip and the peripheral grounding line 30 may be electrically connected to form the closed loop, such wiring design of the auxiliary grounding lead line 33 all falls within the protection scope of the present disclosure.

For example, as shown in FIG. 3, the second grounding pin GND4 of one of two outermost driving units 20 (refer to the leftmost driving unit in FIG. 3) is connected to the second grounding pin GND4' of its adjacent driving unit 20 through the second auxiliary lead line 32, and the second grounding pin GND4 of the other of two outermost driving units 20 (refer to the rightmost driving unit in FIG. 3) is connected to the second grounding pin GND4' of its adjacent driving unit 20 through the second auxiliary lead line 32; the second grounding pins GND4' of other driving units 20 are correspondingly connected to the second grounding pins GND4' of their adjacent driving units 20 through the second auxiliary lead lines 32 respectively.

The peripheral grounding line 30 is disposed on the periphery of the display region 12 of the array substrate; one end of the peripheral grounding line 30 is electrically connected to the third grounding pin GND1 of the leftmost driving unit 20 (that is, one outermost driving unit 20 in the arrangement direction of a plurality of driving units 20), and the other end of the peripheral grounding line 30 is electrically connected to the third grounding pin GND1 of the rightmost driving unit 20 (that is, the other outermost driving unit 20 in the arrangement direction of a plurality of driving units 20).

For example, as shown in FIG. 3, the fourth grounding pin GND2 of the leftmost driving unit 20 is connected to the silver glue dot grounding lead line 41, and the fourth grounding pin GND2 of the rightmost driving unit 20 is connected to silver glue dot grounding lead line.

It can be seen from the above embodiment that in the display device according to an embodiment of the present disclosure, the peripheral grounding line and the silver glue dot grounding lead line are disposed and both electrically connected to the grounding line of the driving unit, and the driving unit itself is also electrically connected to the external printed circuit board. Therefore, the static electricity of the peripheral grounding line and the silver glue dot grounding lead line may be directed to the grounding terminal of the printed circuit board, so that the peripheral grounding line and the silver glue dot grounding lead line may both reduce the static electricity. Thus, the conductive tape at the silver glue dot in the existing design scheme may be removed, thereby improving the production efficiency.

Figure 4:
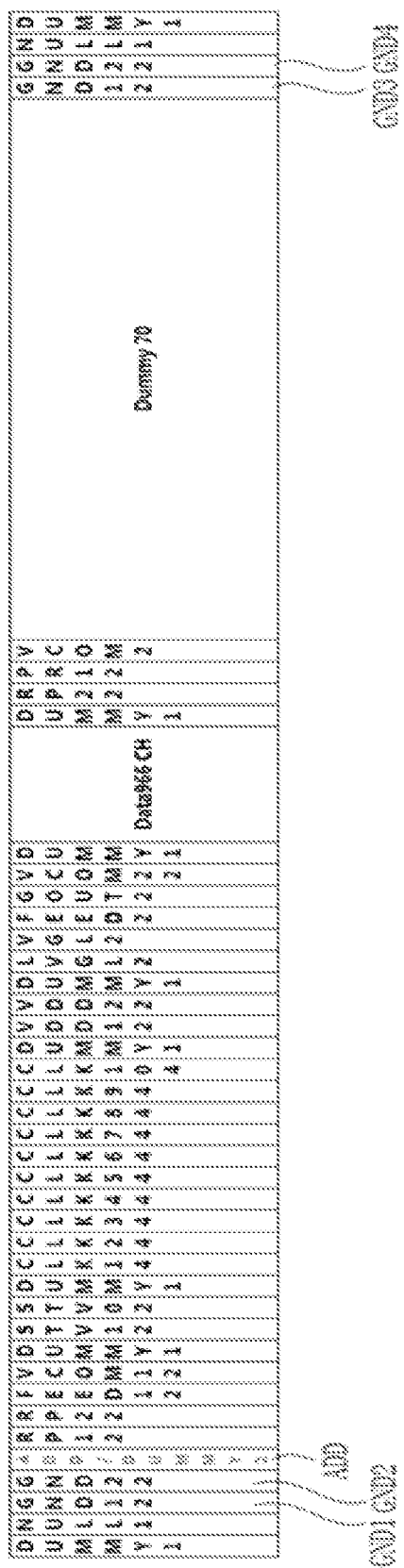
FIG. 4 is a schematic diagram of pin distribution of a driving unit according to an embodiment of the present disclosure.
Figure 5:
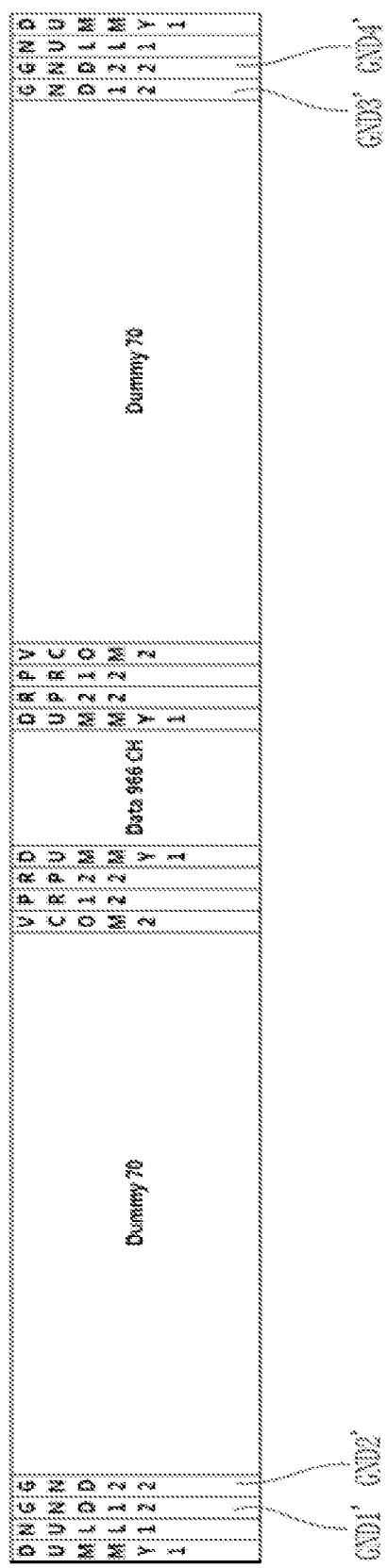
FIG. 5 is a schematic diagram of pin distribution of another driving unit according to an embodiment of the present disclosure.
Figure 6:
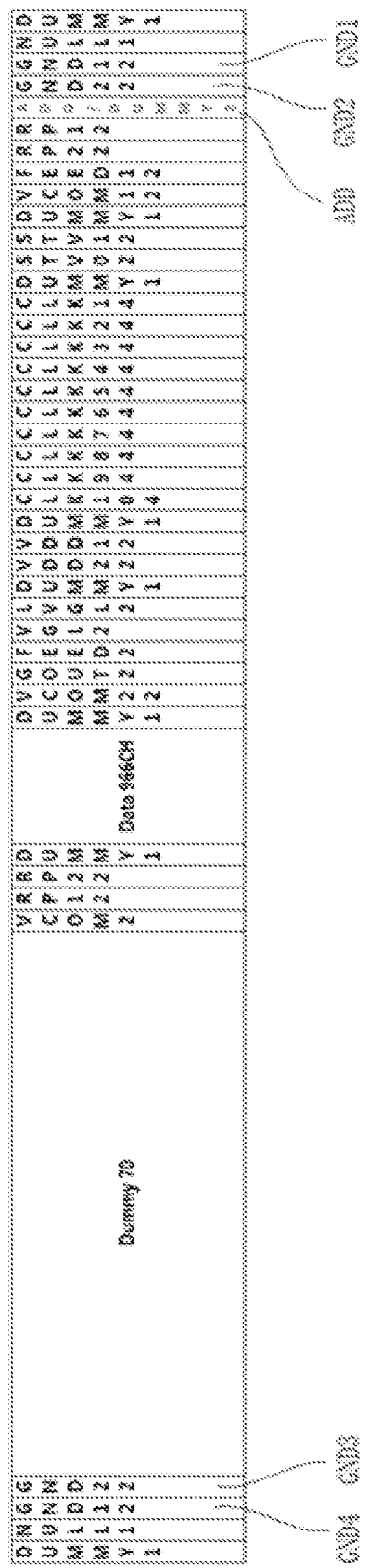
FIG. 6 is a schematic diagram of pin distribution of still another driving unit according to an embodiment of the present disclosure.

FIGS. 4-6 are schematic diagrams of pin distribution of three driving units according to embodiments of the present disclosure. For example, the schematic diagram of the pin distribution of the driving unit shown in FIG. 4 corresponds to the leftmost driving unit in FIG. 3, the schematic diagram of the pin distribution of the driving unit shown in FIG. 5 corresponds to the three middle driving units of FIG. 3, and the schematic diagram of the pin distribution of the driving unit shown in FIG. 6 corresponds to the rightmost driving unit in FIG. 3.

For example, the third grounding pin GND1 of the leftmost driving unit 20 and the third grounding pin GND1 of the rightmost driving unit 20 are connected to two ends of the peripheral grounding line 30 respectively; the fourth grounding pin GND2 of the leftmost driving unit 20 and the fourth grounding pin GND2 of the rightmost driving unit 20 are connected to the silver glue dot grounding lead lines 41 at both sides, respectively; the test pin ADD of the leftmost driving unit 20 and the test pin ADD of the rightmost driving unit 20 are connected to two ends of the test line 50 respectively; the first grounding pin GND3 and the second grounding pin GND4 of the leftmost driving unit 20 are connected to the first grounding pin GND3' and the second grounding pin GND4' of its adjacent driving unit respectively; the first grounding pin GND3 and the second grounding pin GND4 of the rightmost driving unit 20 are connected to the first grounding pin GND3' and the second grounding pin GND4' of its adjacent driving unit respectively; the first grounding pins GND3' and the second grounding pins GND4' of other driving units 20 are connected to the first grounding pins GND3' and the second grounding pins GND4' of their adjacent driving units 20 respectively.

Compared with the traditional solution, the display device according to an embodiment of the present disclosure has an ESD capability to pass the ESD test smoothly without a hidden risk of burnout of circuits in the screen.

It is to be noted that the display device in this embodiment may be any product or component with a display function, such as electronic paper, a mobile phone, a tablet computer, a television, a laptop computer, a digital photo frame, and a navigator.

It may be seen from the above embodiment that in the display device according to an embodiment of the present disclosure, the peripheral grounding line and the silver glue dot grounding lead line are disposed and both electrically connected to the grounding line of the driving unit, and the driving unit itself is also electrically connected to the external printed circuit board. Therefore, the static electricity of the peripheral grounding line and the silver glue dot grounding lead line may be directed to the grounding terminal of the printed circuit board, so that the peripheral grounding line and the silver glue dot grounding lead line may both reduce the static electricity. Thus, the conductive tape at the silver glue dot in the existing design scheme may be removed, thereby improving the production efficiency.

An embodiment of the present disclosure further provides a driving circuit of a display device. As shown in FIG. 1, the driving circuit of the display device includes at least one driving unit 20; the driving unit 20 includes a first grounding pin GND1 and a second grounding pin GND2. The first grounding pin GND1 is configured to be electrically connected to the peripheral grounding line 30 of the display panel; the second grounding pin GND2 is configured to be electrically connected to the silver glue dot grounding lead line 41 of the display panel.

It can be seen from the above embodiment that in the driving circuit of the display device according to an embodiment of the present disclosure, the first grounding pin and the second grounding pin are disposed to connect the peripheral grounding line and the silver glue dot grounding lead line of the display panel, and the driving unit itself is also electrically connected to the external printed circuit board. Therefore, the static electricity of the peripheral grounding line and the silver glue dot grounding lead line may be directed to the grounding terminal of the printed circuit board, so that the peripheral grounding line and the silver glue dot grounding lead line of the display panel may both reduce the static electricity. Thus, the conductive tape at the silver glue dot of the display device in the related art may be removed, thereby improving the production efficiency.

Persons of ordinary skill in the art are to be understood that described above are merely specific embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display device, comprising:
   an array substrate comprising a peripheral region and a display region, and further comprising a peripheral grounding line that is located in the peripheral region and surrounds the display region;
   at least two driving units located on at least one side of the array substrate, wherein the driving unit comprises at least one grounding pin, a grounding pin of at least one of the driving units is connected to the peripheral grounding line, and each of at least one grounding pin of one of two adjacent driving units is electrically connected to a corresponding grounding pin of the other adjacent driving unit; and
   a silver glue dot disposed on the array substrate and located in the peripheral region, wherein the array substrate further comprises a silver glue dot grounding lead line located in the peripheral region, and the silver glue dot is connected to a grounding pins through the silver glue dot grounding lead line.

2. The display device according to claim 1, wherein the array substrate further comprises at least one first auxiliary lead line, the first auxiliary lead line is located in the peripheral region and arranged along a first side edge of the array substrate, and the first side edge is the side edge where the driving units are located;
   each of the driving units comprises a first grounding pin, and first grounding pins of two adjacent driving units are connected by one of the first auxiliary lead lines.

3. The display device according to claim 2, wherein the array substrate further comprises an auxiliary grounding lead line located in the peripheral region, and the first auxiliary lead line is electrically connected to the peripheral grounding line through the auxiliary grounding lead line.

4. The display device according to claim 3, wherein the auxiliary grounding lead line comprises a first sub-lead and a second sub-lead;
   the first sub-lead extends along the first side edge, and two ends of the first sub-lead are connected to two ends of the peripheral grounding line, respectively;
   the second sub-lead is in one-to-one correspondence with the first auxiliary lead line, and two ends of the second sub-lead are connected to the first sub-lead and a corresponding first auxiliary lead line, respectively.

5. The display device according to claim 2, wherein the array substrate further comprises a second auxiliary lead line that is in one-to-one correspondence with the first auxiliary lead line and arranged along the first side edge and located at a side of the corresponding first auxiliary lead line (31) away from the display region;
   each of the driving units further comprises a second grounding pin, and second grounding pins of two adjacent driving units are connected by one of the second auxiliary lead lines.

6. The display device according to claim 2, wherein each of the at least two driving units further comprises a third grounding pin, and two ends of the peripheral grounding line are connected to third grounding pins of two outermost driving units in an arrangement direction of the at least two driving units.

7. The display device according to claim 1, further comprising at least two silver glue dots and at least two silver glue dot grounding lead lines, wherein the silver glue dots disposed on the array substrate and located in the peripheral region, and each of the silver glue dots is connected to a grounding pin through a corresponding silver glue dot grounding lead line;
   the silver glue dots is in one-to-one correspondence with the silver glue dot grounding lead lines, two of the silver glue dot grounding lead lines are located at two ends of a first side edge, respectively, and the first side edge is the side edge where the driving units is located.

8. The display device according to claim 1, wherein the silver glue dot grounding lead line is insulated from the peripheral grounding line.

9. The display device according to claim 1, wherein the array substrate further comprises:
   a test line located in the peripheral region and at a side of the peripheral grounding line close to the display region, and
   each of at least one of the driving units further comprises a test pin connected to the test line.

10. The display device according to claim 9, wherein the test line surrounds the display region, each of two outermost driving units in an arrangement direction of the at least two driving units comprises the test pin, and two ends of the test line are connected to two of the test pins of the two outermost driving units, respectively.

11. The display device according to claim 10, wherein the test line is configured to receive a test signal at a test stage and receive a ground signal at a display stage.

12. The display device according to claim 1, wherein the peripheral grounding line is located at the outermost side of the peripheral region.

13. The display device according to claim 1, wherein the peripheral grounding line is located at at least one of a source drain metal layer and/or a gate metal layer.

14. The display device according to claim 1, wherein the number of the driving units is 2-10.

15. The display device according to claim 1, wherein the driving unit is a flip chip thin film circuit.

16. The display device according to claim 1, wherein the array substrate further comprises:
   a gate driving circuit located in the peripheral region and at a side of the peripheral grounding line close to the display region.

17. The display device according to claim 1, further comprising a printed circuit board, wherein a grounding lead line of the printed circuit board is electrically connected to each grounding pin of the driving units.

18. A display device, comprising:

an array substrate comprising a peripheral region and a display region, wherein the peripheral region surrounds the display region;

at least two driving units located at a first side edge of the array substrate;

a color filter substrate in a connection with the array substrate to form a cell between two substrates opposite to each other; and a silver glue dot located in the peripheral region and connected to the array substrate and the color filter substrate, respectively, wherein the driving unit comprises a first grounding pin, a second grounding pin, a third grounding pin and a fourth grounding pin; along an arrangement direction of the driving unit, the third grounding pin, the fourth grounding pin, the first grounding pin and the second grounding pin on a m-th driving unit are arranged sequentially, and the second grounding pin, the first grounding pin, the fourth grounding pin and the third grounding pin on a n-th driving unit are arranged sequentially, wherein m is an odd number and n is an even number;

the array substrate comprises a peripheral grounding line, a first auxiliary lead line, a second auxiliary lead line, an auxiliary grounding lead line and two silver glue dot grounding lead lines which are located in the peripheral region;

the peripheral grounding line surrounds the display region and is arranged along a second side edge other than the first side edge of the array substrate, and two ends of the peripheral grounding line are connected to the third grounding pins of two outermost driving units in the arrangement direction of the at least two driving units, respectively;

the first auxiliary lead line is arranged along the first side edge of the array substrate, and first grounding pins of two adjacent driving units are connected by one of the first auxiliary lead lines;

the auxiliary grounding lead line comprises a first sub-lead and a second sub-lead, the first sub-lead extends along the first side edge, two ends of the first sub-lead are connected to two ends of the peripheral grounding line respectively, the second sub-lead is in one-to-one correspondence with the first auxiliary lead line, and two ends of the second sub-lead are connected to the first sub-lead and a corresponding first auxiliary lead line, respectively;

the second auxiliary lead line is in one-to-one correspondence with the first auxiliary lead line and arranged along the first side edge and located at a side of a corresponding first auxiliary lead line away from the display region, and second grounding pins of two adjacent driving units are connected by one of the second auxiliary lead lines;

one end of each of the two silver glue dot grounding lead lines is connected to a corresponding silver glue dot, respectively, and the other end of each of the two silver glue dot grounding lead lines is connected to the fourth grounding pin of each of the two outermost driving units in the arrangement direction of the at least two driving units, respectively.

19. The display device according to claim 18, wherein the two outermost driving units respectively comprise a test pin in the arrangement direction of the at least two driving units;

the array substrate further comprises a test line located in the peripheral region and at a side of the peripheral grounding line close to the display region, the test line surrounds the display region, and two ends of the test line are connected to two test pins, respectively.

* * * * *